(12) United States Patent
Cowan et al.

(10) Patent No.: US 6,817,004 B2
(45) Date of Patent: Nov. 9, 2004

(54) NET SEGMENT ANALYZER FOR CHIP CAD LAYOUT

(75) Inventors: Joseph W. Cowan, West Linn, OR (US); Jeffrey E. Blackwood, Portland, OR (US); Tracy D. Myers, Clackamas, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/349,564

(22) Filed: Jan. 22, 2003

(65) Prior Publication Data

US 2004/0143809 A1 Jul. 22, 2004

(51) Int. Cl.[7] .............................................. G06F 17/50
(52) U.S. Cl. ............................................. 716/11; 716/8
(58) Field of Search ...................................... 716/11, 8

(56) References Cited

U.S. PATENT DOCUMENTS 5,220,512 A     6/1993  Watkins et al. ............... 716/11
5,367,308 A  *  11/1994 Weber ................. 343/700 MS
5,392,222 A  *  2/1995  Noble ......................... 716/19
5,895,462 A  *  4/1999  Toki .............................. 707/3
5,937,190 A  *  8/1999  Gregory et al. ............. 717/131

OTHER PUBLICATIONS

"Schematic Capture. Start Your Design"; Schematic Capture; Protel 99 SE; Dec. 16, 1999; pp. 1–7.
"Eliminate Guesswork With Board Signal"; Signal Integrity; Protel 99 SE; Dec. 16, 1999; pp. 21–23.
"Versatile Schematic or CUPL–based"; Programmable Logic Design; Protel 99 SE; Dec. 16, 1999; pp. 25–27.

* cited by examiner

Primary Examiner—Vuthe Siek
Assistant Examiner—Sun James Lin
(74) Attorney, Agent, or Firm—Fitch, Even, Tabin & Flannery

(57) ABSTRACT

A method of displaying a net in a CAD layout for an integrated circuit chip includes steps for receiving a netlist of an integrated circuit design, displaying a CAD layout of the netlist, selecting a net segment in the CAD layout, and displaying a physical characteristics list of information items representative of physical characteristics of the net segment.

26 Claims, 7 Drawing Sheets

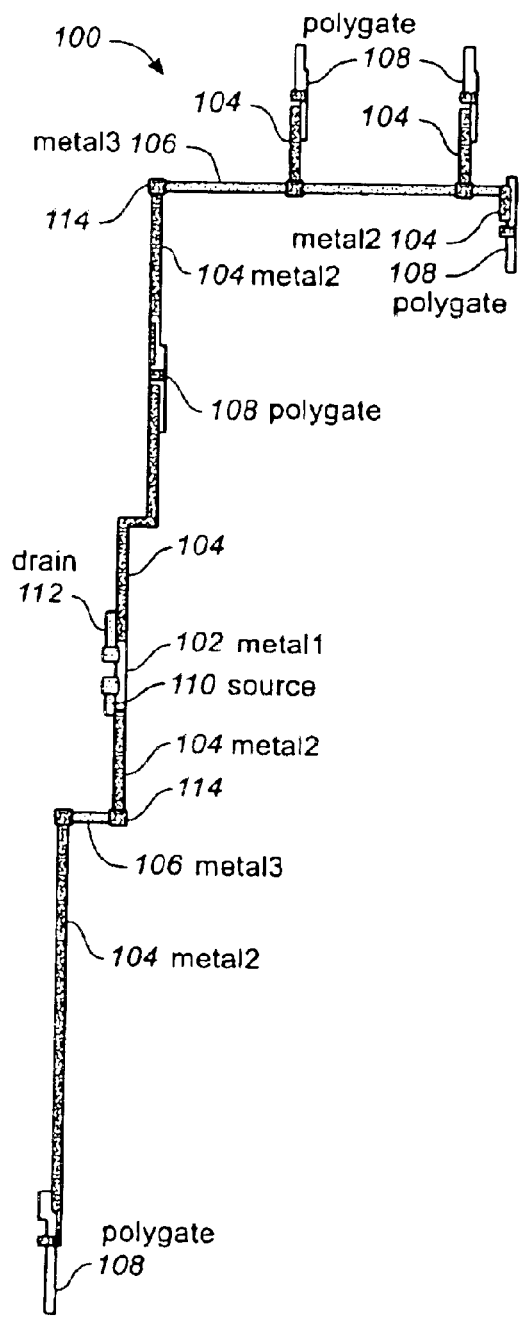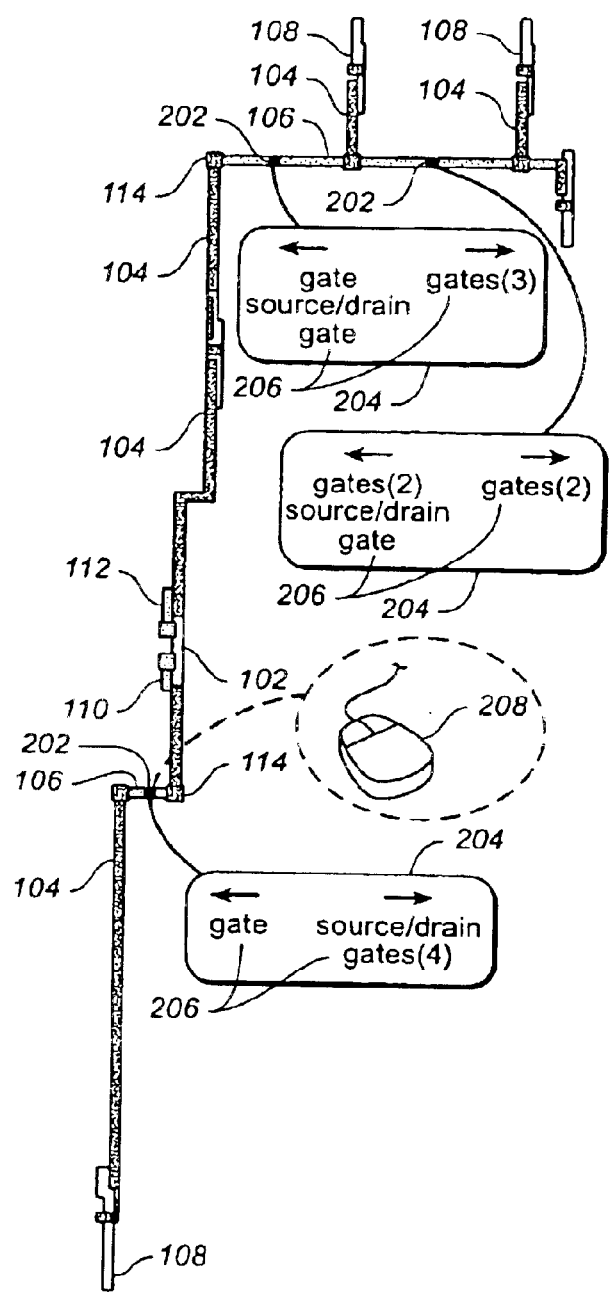
FIG._1
(PRIOR ART)
FIG._2

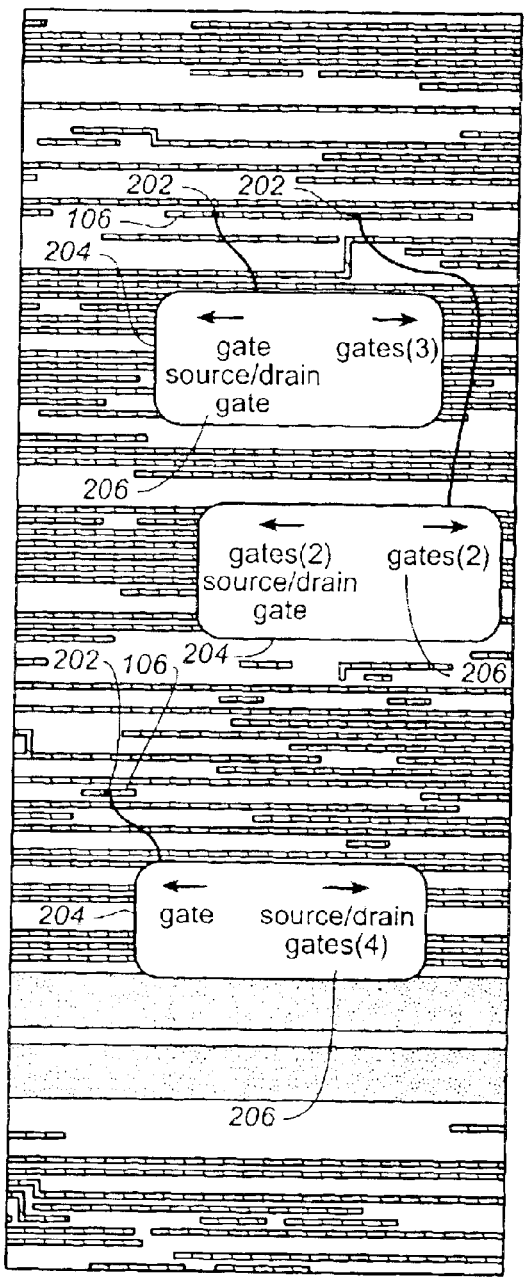 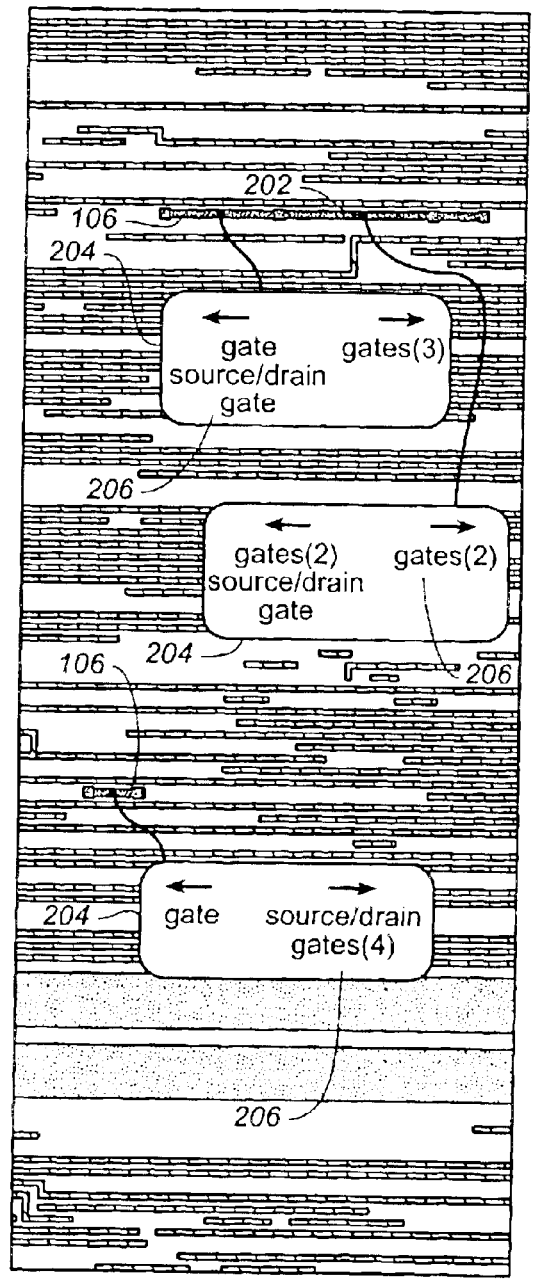
FIG._3          FIG._4

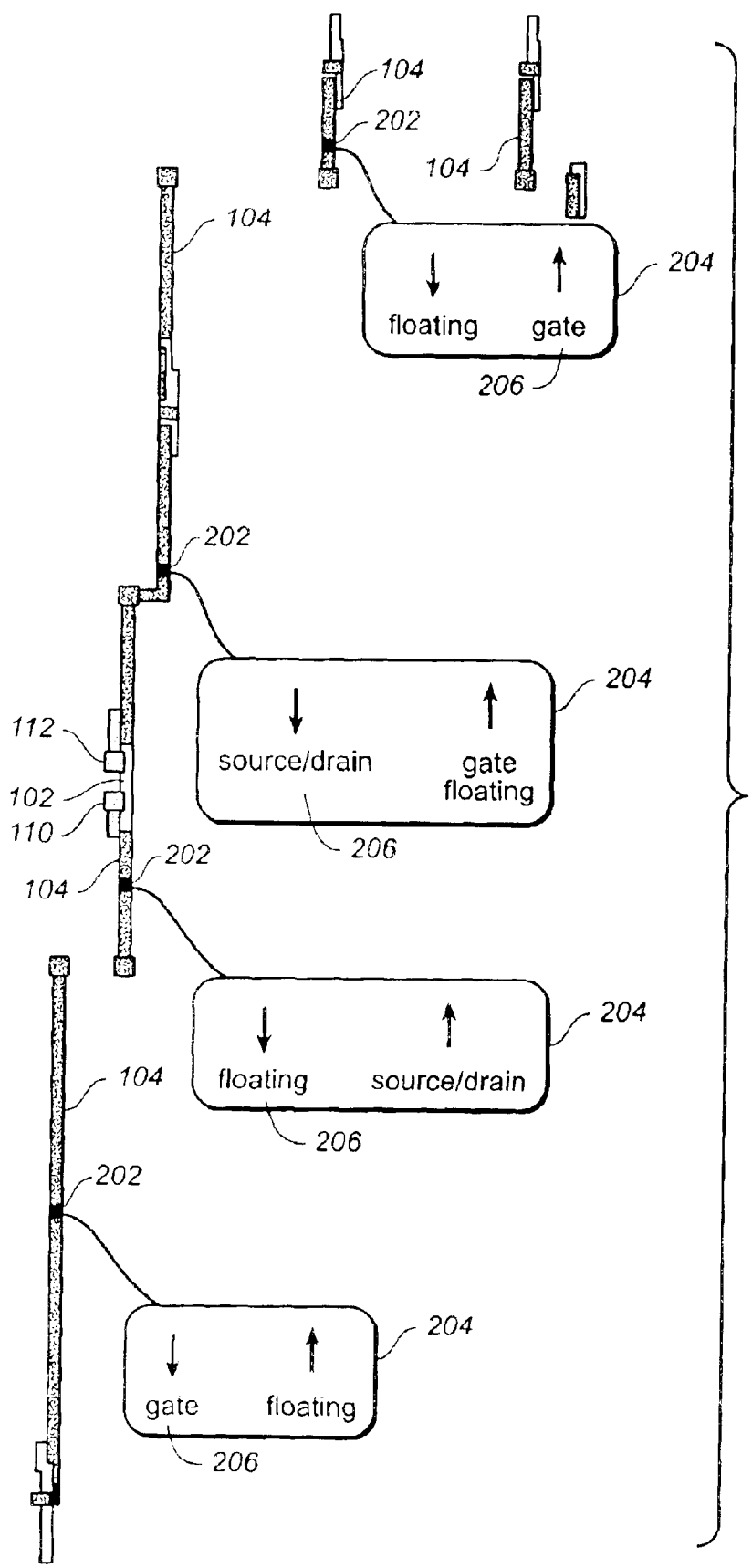
FIG._5

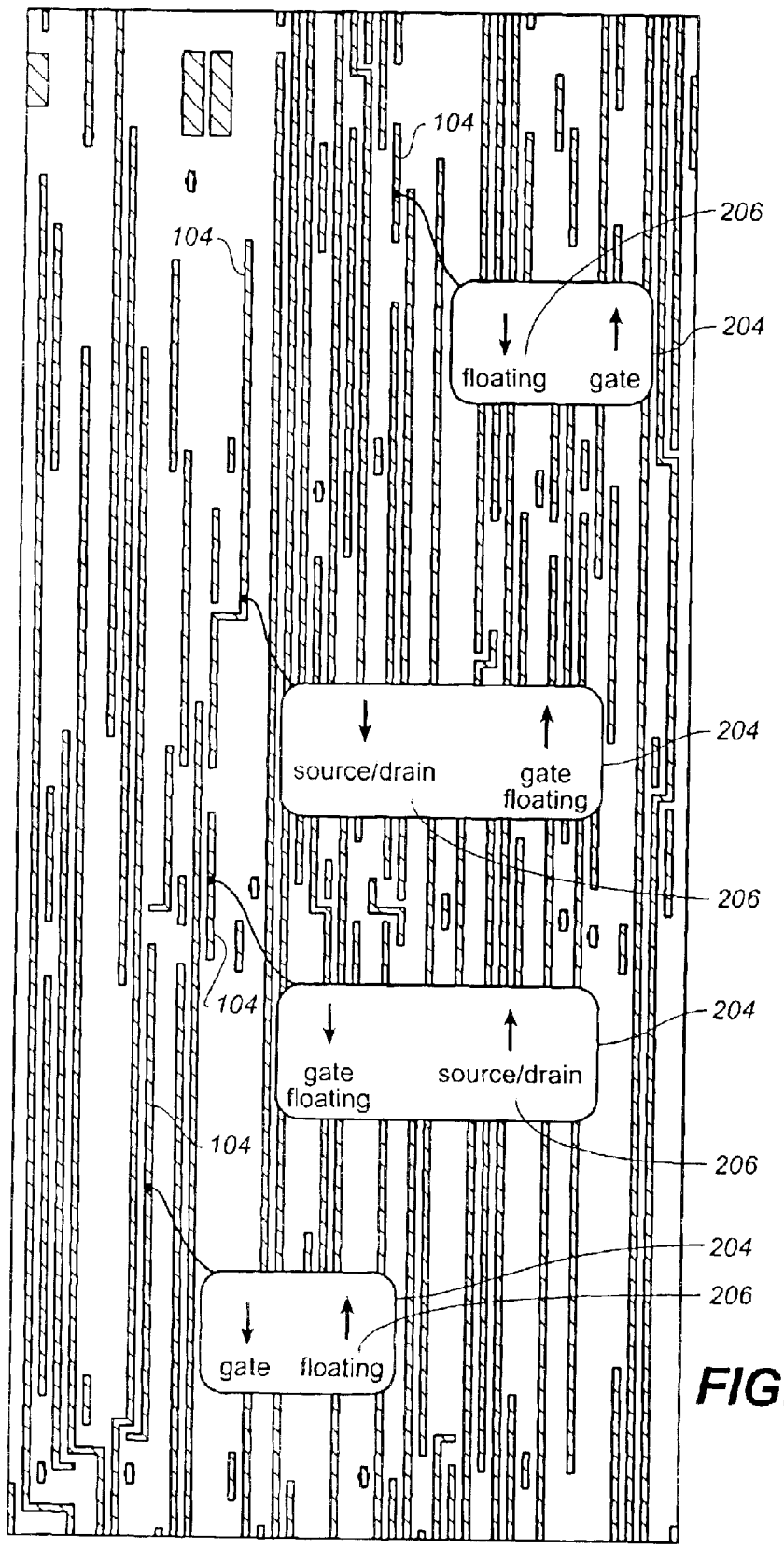
FIG._6

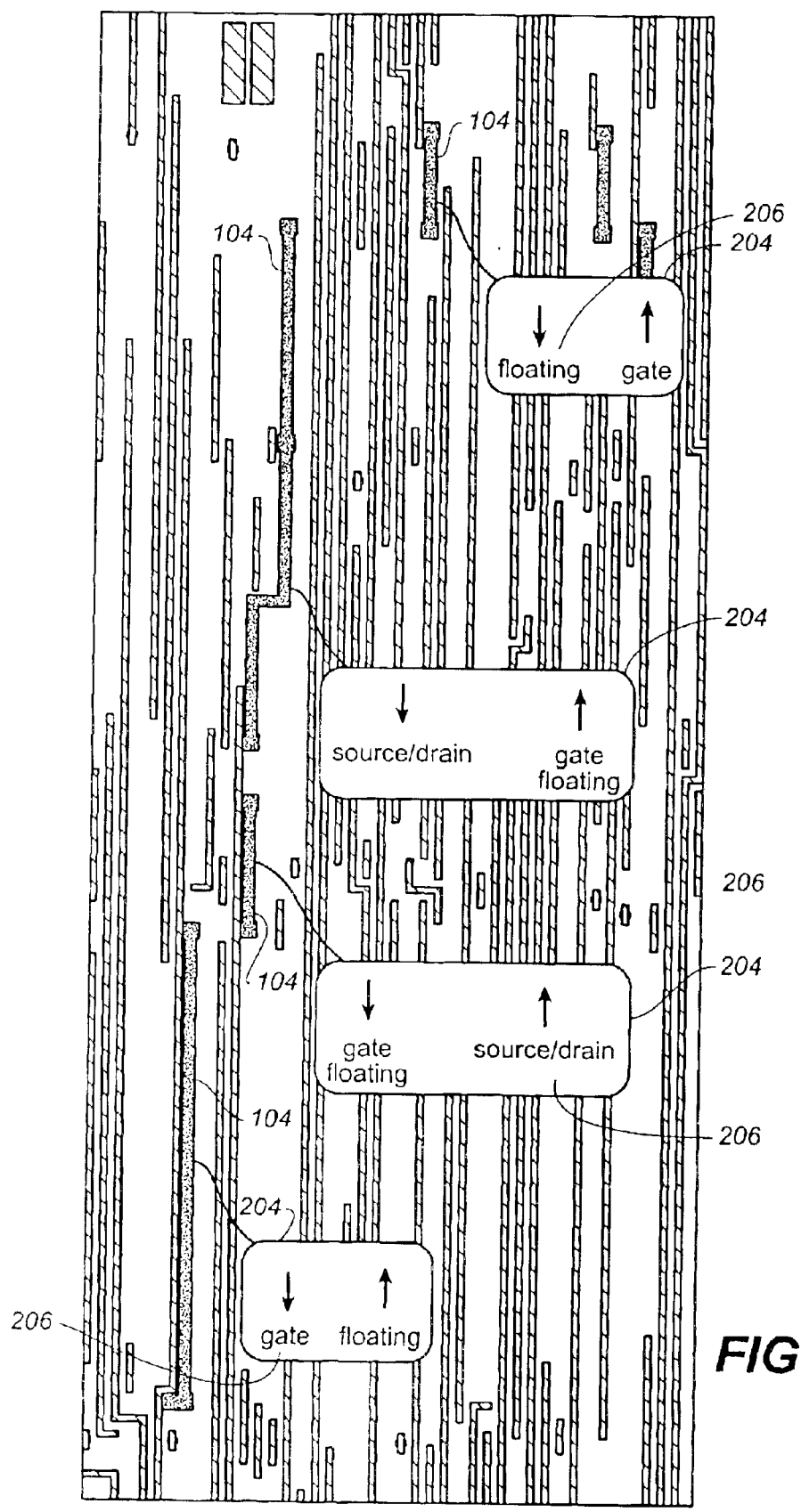
FIG._7

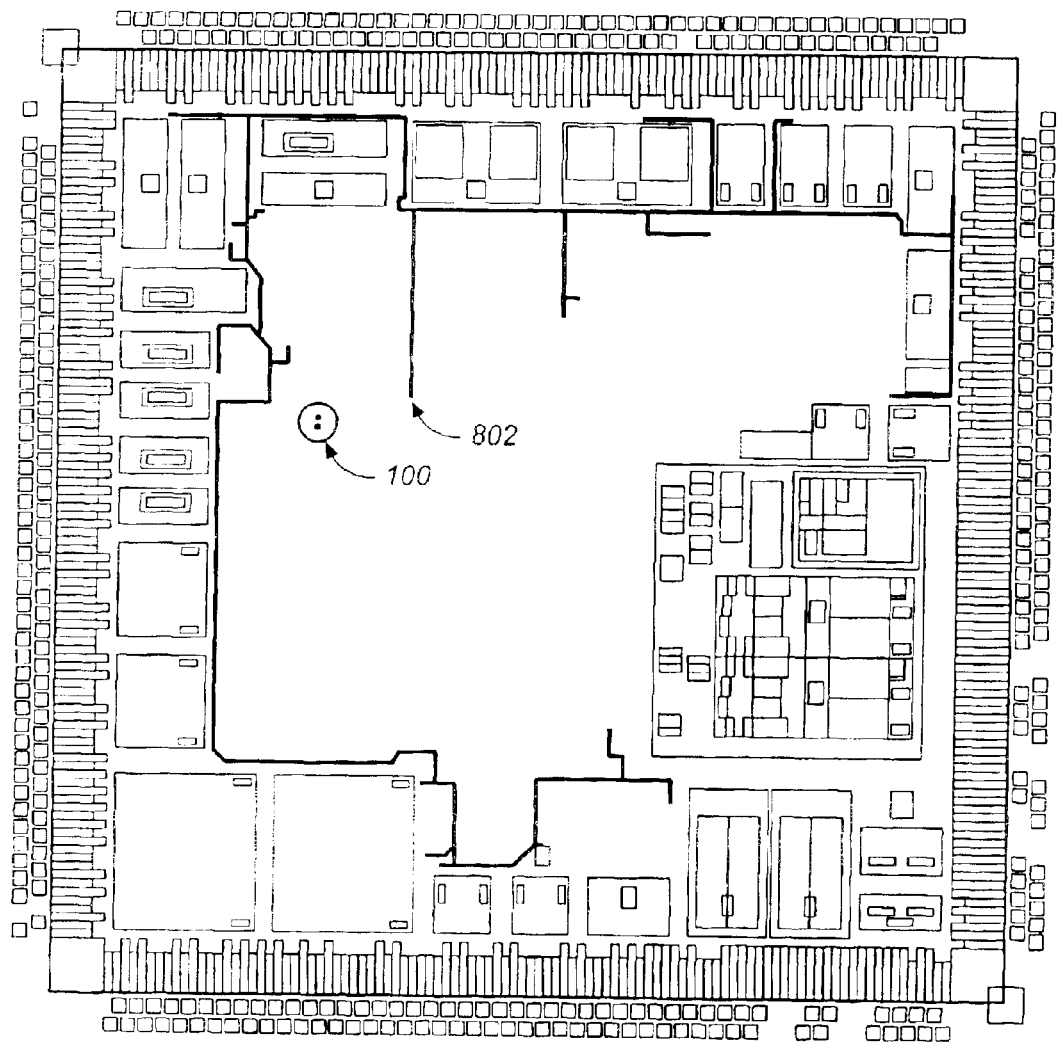
FIG._8

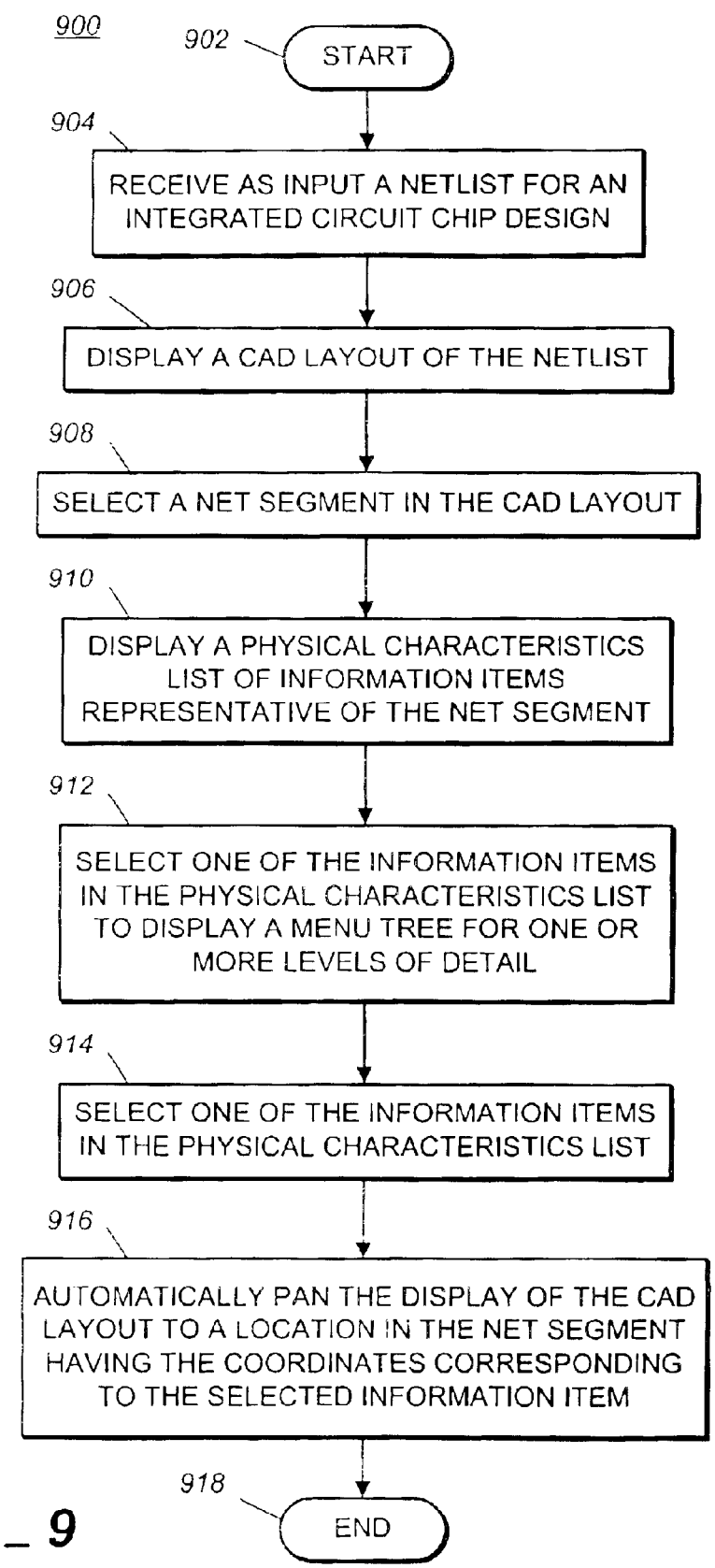
FIG._ 9

NET SEGMENT ANALYZER FOR CHIP CAD LAYOUT

BACKGROUND OF THE INVENTION

1. Field of the Invention

The present invention is directed to computer aided design (CAD) of integrated circuits. More specifically, but without limitation thereto, the present invention is directed to a method of determining the physical characteristics of a selected net in a CAD layout of an integrated circuit chip design.

2. Description of the Prior Art

A typical CAD layout for an integrated circuit chip design typically includes a large number of nets. Each net connects an output of a device, such as a logic gate or a transistor, to the inputs of one or more devices in the net that constitute the integrated circuit. In analyzing a net from the CAD layout, it is often useful to see how the net is structurally connected to the devices connected to the net. A visual inspection of the net structure may assist the user in interpreting voltage contrast images, in analyzing failure mechanisms, in determining where to make circuit modifications, and in understanding the design layout. Previous methods for visually inspecting nets in an integrated circuit design include manipulating the CAD layout by changing the field of view, zooming, panning, and making various layers of the circuit design visible and hidden to trace the net routing manually. Such methods are generally time consuming and error prone.

SUMMARY OF THE INVENTION

In one aspect of the present invention, a method of displaying a net in a CAD layout for an integrated circuit chip includes steps for receiving a netlist of an integrated circuit design, displaying a CAD layout of the netlist, selecting a net segment in the CAD layout, and displaying a physical characteristics list of information items representative of physical characteristics of the net segment.

In another aspect of the present invention, a computer program product for displaying a net in a CAD layout for an integrated circuit chip includes a medium for embodying a computer program for input to a computer and a computer program embodied in the medium for causing the computer to perform the following functions: displaying a CAD layout of an integrated circuit chip, selecting a net segment in the CAD layout, and displaying a physical characteristics list of information items representative of physical characteristics of the net segment.

DESCRIPTION OF THE DRAWINGS

The present invention is illustrated by way of example and not limitation in the accompanying figures, in which like references indicate similar elements throughout the several views of the drawings, and in which:

FIG. 1 illustrates a CAD layout of the prior art for a net in an integrated circuit chip design;

FIG. 2 illustrates a CAD layout of the net in FIG. 1 including pop-up lists in accordance with an embodiment of the present invention;

FIG. 3 illustrates the CAD layout of only the metal 3 layer including pop-up lists for segments of the net in FIG. 2 without highighting;

FIG. 4 illustrates the CAD layout of FIG. 3 highlighting segments of the net;

FIG. 5 illustrates a CAD layout highlighting portions of the net in FIG. 2 including pop-up lists with the metal 3 layer removed.

FIG. 6 illustrates a CAD layout for portions of the net in FIG. 5 including pop-up lists for only the metal 2 layer;

FIG. 7 illustrates a CAD layout for portions of the net in FIG. 5 including pop-up lists for only the metal 2 layer with highlighting;

FIG. 8 illustrates a CAD layout of the entire integrated circuit chip design highlighting the net in FIG. 2 and a long net; and FIG. 9 illustrates a flow chart for a method of displaying a net in a CAD layout for an integrated circuit chip design according to an embodiment of the present invention.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

FIG. 1 illustrates a CAD layout of a net 100 in an integrated circuit chip design of the prior art. Shown in FIG. 1 are a metal 1 layer net segment 102, metal 2 layer net segments 104, metal 3 layer net segments 106, polygates 108, a source 110, a drain 112, and vias 114.

The CAD layout of the net 100 may be generated and displayed, for example, on a computer monitor (not shown) according to well-known programming techniques from a netlist of an integrated circuit chip design using commercially available computer aided design (CAD) software. The display functions provided with the CAD software generally include zooming and panning, which may be used to isolate and display a portion of the net 100. The net 100 may be traced through the metal 1 layer net segment 102, the metal 2 layer net segments 104, the metal 3 layer net segments 106, polygates 108, the source 110, the drain 112, and the vias 114 by manually panning the display and turning each of the various layer views on and off to assist in identifying the various structures connected to the net. However, this technique requires many steps to identify each structure in the net, and one net may be confused with another net in the process.

In one aspect of the present invention, a method of displaying a net in a CAD layout for an integrated circuit chip includes the steps of receiving a netlist of an integrated circuit design, displaying a CAD layout of the netlist, selecting a portion of a net in the CAD layout, and displaying a physical characteristics list of information items representative of physical characteristics of the net.

FIG. 2 illustrates a CAD layout of the net segment 100 in FIG. 1 including physical characteristics lists in accordance with an embodiment of the present invention. Shown in FIG. 2 are a metal 1 layer net segment 102, metal 2 layer net segments 104, metal 3 layer net segments 106, polygates 108, a source 110, a drain 112, vias 114, net segments 202, physical characteristics lists 204, information items 206, and a computer mouse 208.

The physical characteristics lists 204 may be displayed on the CAD layout in response to selecting a net segment 202. Rather than manually tracing the net 100 as described above with reference to FIG. 1, the display cursor may be positioned by a pointing device, for example, the computer mouse 208, on one of the net segments 202. Once the display cursor is positioned on a net segment 202, the pointing device may be "clicked" or otherwise activated to generate a physical characteristics list 204. Other pointing devices besides the computer mouse 208 may be used to select a net segment 202 to practice the present invention in various embodiments to suit specific applications. In other embodiments of the present invention, the net segment may be selected, for example, by entering a net name, net coordinates, or other identifying information. The net name, net coordinates, or other identifying information may be entered, for example, from a computer keyboard or from a computer generated list.

Each of the physical characteristics lists 204 displays the information items 206 representative of the physical characteristics of the selected net segment 202. For example, the information items 206 may include identification of the structures in the selected net segment 202, such as the number of gates, source/drains, and the type of transistor driving the net. The information items 206 may be displayed in text form as shown in the illustrated examples, or the information items 206 may be displayed as icons according to well-known programming techniques. The position of the physical characteristics lists 204 may be automatically selected so as not to block the selected net segment 202, or the position of the physical characteristics lists 204 may be selected manually if desired according to well-known programming techniques. In other embodiments of the present invention, the information items 206 representative of the physical characteristics of the selected net segment 202 may be generated as output to a computer program for automated net analysis.

The information items 206 identify the physical characteristics of the selected net segment 202, such as vias and metal layers, as well as device structures, such as gates and source/drains, and may include other information to assist in analyzing nets. The information items 206 may be arranged into columns as shown in the physical characteristics lists 204 to indicate the progression of net structures and device structures along the selected net segment 202 in each direction from the cursor position, whether the cursor position is selected by a pointing device or by net coordinates. Each column in the physical characteristics lists 204 corresponds to a direction along the selected net segment 202 away from the cursor position. The number of information items 206 that may be displayed in the physical characteristics lists 204 may also be selected according to well-known computer programming techniques. For example, number of information items 206 may be limited to include up to ten net or device structures in either direction from the cursor position. The information items 206 may also specify the coordinates of each of the structures in the selected net segment 202 and may identify the metal layer of the selected net segment 202.

In one embodiment of the present invention, the information items 206 may include a menu tree to provide multiple levels of detail for any of the structures in the net. For example, clicking on the information item 206 "gates (2)" may generate another physical characteristics list 204 listing the coordinates of each of the two gates. Clicking on either of the coordinates in the second physical characteristics list 204 may generate a third physical characteristics list 204 with still more detailed information, and so on.

In another embodiment of the present invention, one of the information items in the physical characteristics list may be selected to navigate the display of the CAD layout to the location containing the selected information item. For example, clicking on the information item 206 "gate" may automatically pan the display to the coordinates of the selected gate in the net segment 202. The pan may be performed slowly if desired to allow visual examination of the structure of the net segment 202 from the current coordinates to the coordinates selected from the physical characteristics list 204. In another embodiment of the present invention, the user may select a via from a physical characteristics list 204 so that the displayed coordinates will automatically pan to the coordinates of the selected via. This feature may be used, for example, to facilitate modifying the net by focused ion beam (FIB) cross-sectioning. Also, the information items 206 may include a navigation icon that pans the cursor back to the original cursor position.

FIG. 3 illustrates the CAD layout of only the metal 3 layer including physical characteristics lists for net segments 202 in FIG. 2 without highlighting. Shown in FIG. 3 are metal 3 layer net segments 106, selected portions of the net 202, and physical characteristics lists 204.

The same physical characteristics lists 204 shown in the example of FIG. 2 may be generated by clicking on the corresponding net segments 202.

FIG. 4 illustrates the CAD layout of FIG. 3 highlighting the net segments 202 in the metal 3 layer. Shown in FIG. 4 are highlighted metal 3 layer net segments 106, selected net segments 202, and physical characteristics lists 204.

The highlighting facilitates identification of the portions of the net segments 202 to avoid confusing the net segments 202 with other nets. The same physical characteristics lists 204 shown in the example of FIG. 2 may be generated by clicking on the corresponding selected net segments 202.

FIG. 5 illustrates a CAD layout highlighting portions of the net in FIG. 2 including physical characteristics lists 204 with the metal 3 layer removed. Shown in FIG. 5 are highlighted portions in the metal 1 layer 102, the metal 2 layer 104, the source 110, the drain 112, selected net segments 202, and physical characteristics lists 204.

FIG. 6 illustrates a CAD layout for portions of the net in FIG. 5 including physical characteristics lists for only the metal 2 layer without highlighting. Shown in FIG. 6 are the metal 2 layer 104, selected net segments 202, physical characteristics lists 204, information items 206, and a computer mouse 208.

In the example of FIG. 6, selected net segments 202 that are terminated in a layer above the highest layer displayed or that are terminated in a hidden layer are listed in the information items 206 as floating, while physical characteristics in layers lower than the highest layer displayed are included in the information items 206. In another embodiment of the present invention, the layers in which the physical characteristics are included in the information items 206 may be selected independently from the layers being displayed. For example, all the physical characteristics of a net segment 202 may be included in the information items 206 even if only the metal 3 layer is displayed.

FIG. 7 illustrates a CAD layout for portions of the net in FIG. 5 including physical characteristics lists for only the metal 2 layer with highlighting. Shown in FIG. 7 are the metal 2 layer 104, selected net segments 202, physical characteristics lists 204, and information items 206.

The highlighting facilitates identification of the selected net segments 202 to avoid confusion with other nets. The same physical characteristics lists 204 shown in the example of FIG. 6 may be generated by clicking on the corresponding net segments 202.

FIG. 8 illustrates a CAD layout of the entire integrated circuit chip design highlighting the net 100 in FIG. 2 and a long net 802. The long net 802 illustrates the large scope of a net structure that may be traced according to various embodiments of the present invention by selecting net segments as described above. If a net segment in the long net 802 is selected, the display may be automatically zoomed to include only the area of interest. The area of interest may be selected, for example, from the physical characteristics list 804.

In another aspect of the present invention, the physical characteristics list may be generated directly from a netlist without a CAD display by entering the name or other identification of the net segment, layers to be included in identifying net structures and device structures in the physical characteristics list, and other selected parameters as desired. The physical characteristics list may then be generated as output to a computer program for statistical analysis, and so on.

FIG. 9 illustrates a flow chart 900 for a method of displaying a net in a CAD layout for an integrated circuit chip according to an embodiment of the present invention.

Step 902 is the entry point of the flow chart 900.

In step 904, a netlist for an integrated circuit chip design is received as input.

In step 906, a CAD layout of the netlist is displayed by, for example, commercially available CAD software.

In step 908, a net segment in the CAD layout is selected, for example, by a pointing device, net name, or net coordinates.

In step 910, a physical characteristics list of information items representative of the selected net segment is displayed according to well known computer programming techniques. The information items may identify physical characteristics of the net structure, such as vias and metal layers, as well as device structures, such as gates and source/drains, and may include other information to assist in analyzing nets, such as a gate, a source/drain, and the type of transistor driving the net.

In step 912, one of the information items in the physical characteristics list is selected to display a menu tree to provide one or more levels of detail. The levels of detail may include for example, coordinates of a structure in the selected portion of the net, identification of a metal layer of the selected portion of the net, the relative distance from a current cursor position to a net structure or a device structure, and the absolute distance between one net structure or device structure and another.

In step 914, one of the information items in the physical characteristics list, for example, a gate, is selected.

In step 916, the display of the CAD layout is automatically panned to a location in the net having the coordinates corresponding to the selected information item.

Step 918 is the exit point of the flow chart 900.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

The search function illustrated by the flow chart 900 of FIG. 9 may be embodied in a computer program product and implemented by instructions for a computer according to well known programming techniques.

In another aspect of the present invention, a computer program product for displaying a net in a CAD layout for an integrated circuit chip includes a medium for embodying a computer program for input to a computer and a computer program embodied in the medium for causing the computer to perform the following functions: displaying a CAD layout of an integrated circuit chip, selecting a net segment in the CAD layout, and displaying a physical characteristics list of information items representative of physical characteristics of the net segment.

While the invention herein disclosed has been described by means of specific embodiments and applications thereof, numerous modifications and variations may be made thereto by those skilled in the art without departing from the scope of the invention set forth in the following claims.

What is claimed is:

1. A method of tracing a net in a computer aided design (CAD) layout for an integrated circuit chip comprising steps for:
   receiving a netlist of an integrated circuit design;
   displaying a CAD layout of the netlist;
   selecting a net segment from the CAD layout at a cursor position;
   identifying physical characteristics of the net segment; and
   displaying a physical characteristics list of information items representative of a progression of at least one of a net structure and a device structure along the net segment and a corresponding direction thereof from the cursor position.

2. The method of claim 1 further comprising selecting one of the information items to display a menu tree to provide a relative or an absolute distance from the cursor position to the at least one of a net structure and a device structure.

3. The method of claim 1 wherein the at least one of a net structure and a device structure includes a metal layer, a via, a gate, a source, a drain, or a type of transistor driving the net segment.

4. The method of claim 3 wherein the information items specify coordinates of the at least one of a net structure and a device structure in the net segment.

5. The method of claim 1 wherein the information items identify a metal layer of the net segment.

6. The method of claim 1 further comprising the steps of:
   selecting one of the information items in the physical characteristics list; and
   navigating the display of the CAD layout to a location in the net segment in response to the selection of one of the information items.

7. The method of claim 6 wherein the step of navigating includes panning the displayed CAD layout to coordinates of a selected information item for performing a visual examination of the net segment from the cursor position to the coordinates of a selected information item.

8. The method of claim 1 further comprising a step for selecting which layers of the integrated circuit chip are to be included in identifying the physical characteristics of the net segment from the netlist.

9. The method of claim 1 further comprising a step for selecting layers for which the physical characteristics are included in the information items independently from the layers being displayed.

10. The method of claim 1 wherein the cursor position is selected by a pointing device or by net coordinates.

11. A computer program product for displaying a net in a CAD layout for an integrated circuit chip comprising:
   a medium for embodying a computer program for input to a computer; and a computer program embodied in the medium for causing the computer to perform the following functions:
  displaying a CAD layout of an integrated circuit chip;
  selecting a net segment in the CAD layout at a cursor position; and
  displaying a physical characteristics list of information items representative of a progression of at least one structure along the net segment and a corresponding direction thereof from the cursor position.

12. The computer program product of claim 11 further comprising selecting one of the information items to display a menu tree to provide a relative or an absolute distance from the cursor position to the at least one of a net structure and a device structure.

13. The computer program product of claim 11 wherein the at least one of a net structure and a device structure includes a metal layer, a via, a gate, a source, a drain, or a type of transistor driving the net segment.

14. The computer program product of claim 13 wherein the information items specify coordinates of the at least one structure in the net segment.

15. The computer program product of claim 11 wherein the information items specify a metal layer of the net segment.

16. The computer program product of claim 11 further comprising the following functions:
  selecting one of the information items in the physical characteristics list; and
  navigating the display of the CAD layout to a location in the net segment in response to the selection of one of the information items.

17. The computer program product of claim 16 wherein the function of navigating includes panning the displayed CAD layout to coordinates of a selected information item for performing a visual examination of the net segment from the cursor position to the coordinates of a selected information item.

18. The computer program product of claim 11 further comprising a function for selecting which layers of the integrated circuit chip are to be included in identifying the physical characteristics of the net segment from the netlist.

19. The computer program product of claim 11 further comprising a step for selecting layers for which the physical characteristics are included in the information items independently from the layers being displayed.

20. The computer program product of claim 11 wherein the cursor position is selected by a pointing device or by net coordinates.

21. A method of tracing a net in a computer aided design (CAD) layout for an integrated circuit chip comprising steps for:
  receiving a netlist of an integrated circuit design;
  selecting a net segment from the netlist at a cursor position;
  identifying physical characteristics of the net segment from the netlist; and
  generating as output a physical characteristics list of information items representative of a progression of at least one structure along the net segment and a corresponding direction thereof from the cursor position.

22. The method of claim 21 further comprising a step for selecting which layers of the integrated circuit chip are to be included in identifying the physical characteristics of the net segment from the netlist.

23. The method of claim 21 wherein the net segment is selected by entering a net name, net coordinates, or other identifying information.

24. The method of claim 21 wherein the cursor position is selected by a pointing device or by net coordinates.

25. A method of tracing a net in a computer aided design (CAD) layout for an integrated circuit chip comprising steps for:
  (a) receiving a netlist of an integrated circuit design;
  (b) selecting a net segment from the CAD layout at a cursor position; and
  (c) generating as output a physical characteristics list of information items representative of a progression of at least one of a net structure and a device structure along the net segment and a corresponding direction thereof from the cursor position.

26. The method of claim 25 wherein step (b) comprises entering a name or other identification of the net segment and a metal layer to be included in identifying the at least one of a net structure and a device structure.

* * * * *